United States Patent
Jeong et al.

(10) Patent No.: US 9,115,287 B2
(45) Date of Patent: Aug. 25, 2015

(54) COMPOSITION FOR MANUFACTURING OXIDE SEMICONDUCTOR AND METHOD FOR MANUFACTURING THIN-FILM TRANSISTOR SUBSTRATE USING THE SAME

(71) Applicants: Samsung Display Co., Ltd., Yongin, Gyeonggi-Do (KR); Industry-Academic Cooperation Foundation, Yonsei University, Seoul (KR)

(72) Inventors: Yeon-Taek Jeong, Seoul (KR); Bo-Sung Kim, Seoul (KR); Doo-Hyoung Lee, Suwon-si (KR); Doo-Na Kim, Seongnam-si (KR); Eun-Hye Park, Incheon (KR); Dong-Lim Kim, Seoul (KR); Hyun-Jae Kim, Seoul (KR); You-Seung Rim, Seoul (KR); Hyun-Soo Lim, Goyang-si (KR)

(73) Assignee: Samsung Display Co., Ltd. (KR)

( * ) Notice: Subject to any disclaimer, the term of this patent is extended or adjusted under 35 U.S.C. 154(b) by 218 days.

(21) Appl. No.: 13/670,120

(22) Filed: Nov. 6, 2012

(65) Prior Publication Data

US 2013/0171779 A1    Jul. 4, 2013

(30) Foreign Application Priority Data

Dec. 29, 2011  (KR) .................. 10-2011-0145657

(51) Int. Cl.
| | | |
|---|---|---|
| H01L 21/00 | (2006.01) | |
| C09D 5/00 | (2006.01) | |
| H01L 29/66 | (2006.01) | |
| C04B 35/453 | (2006.01) | |
| H01L 29/24 | (2006.01) | |
| H01L 29/786 | (2006.01) | |
| H01L 27/12 | (2006.01) | |
| H01L 29/22 | (2006.01) | |
| C04B 35/01 | (2006.01) | |
| C04B 35/457 | (2006.01) | |
| C04B 35/622 | (2006.01) | |

(52) U.S. Cl.
CPC . *C09D 5/00* (2013.01); *C04B 35/01* (2013.01); *C04B 35/453* (2013.01); *C04B 35/457* (2013.01); *C04B 35/62222* (2013.01); *H01L 27/1225* (2013.01); *H01L 29/22* (2013.01); *H01L 29/24* (2013.01); *H01L 29/66742* (2013.01); *H01L 29/66969* (2013.01); *H01L 29/7869* (2013.01); *C04B 2235/3284* (2013.01); *C04B 2235/3286* (2013.01); *C04B 2235/3293* (2013.01); *C04B 2235/443* (2013.01); *C04B 2235/444* (2013.01); *C04B 2235/449* (2013.01)

(58) Field of Classification Search
CPC ..... H01L 27/1225; H01L 29/22; H01L 29/24; H01L 29/66742; H01L 29/66969; H01L 29/7869
USPC ............................. 438/99, 151, 158
See application file for complete search history.

(56) References Cited

U.S. PATENT DOCUMENTS

| 7,906,415 | B2 | 3/2011 | Li et al. |
| 7,947,537 | B2 | 5/2011 | Honda et al. |
| 2003/0194825 | A1* | 10/2003 | Law et al. ........... 438/30 |
| 2004/0221876 | A1 | 11/2004 | Waleh et al. |
| 2010/0184253 | A1 | 7/2010 | Hirai et al. |

* cited by examiner

*Primary Examiner* — Su C Kim
*Assistant Examiner* — Colleen E Snow
(74) *Attorney, Agent, or Firm* — Innovation Counsel LLP

(57) ABSTRACT

According to a method of manufacturing a thin film transistor substrate, a composition including a metal oxalate and a solvent for manufacturing an oxide semiconductor is coated to form a thin film, the thin film is annealed, and the thin film is patterned to form a semiconductor pattern.

6 Claims, 6 Drawing Sheets

COMPOSITION FOR MANUFACTURING OXIDE SEMICONDUCTOR AND METHOD FOR MANUFACTURING THIN-FILM TRANSISTOR SUBSTRATE USING THE SAME

PRIORITY STATEMENT

This application claims priority under 35 U.S.C. §119 to Korean Patent Application No. 10-2011-0145657, filed on Dec. 29, 2011 in the Korean Intellectual Property Office (KIPO), the contents of which are herein incorporated by reference in its entirety.

BACKGROUND

1. Field

The present invention relates to a composition used for manufacturing an oxide semiconductor and a method of manufacturing a thin film transistor substrate using the composition. More particularly, the present invention relates to a composition used for manufacturing an oxide semiconductor that can be heat-treated at a low temperature and a method of forming a thin film transistor substrate using the composition.

2. Description of the Related Art

Generally, a thin film transistor for driving a pixel in a display apparatus includes a gate electrode, a source electrode, a drain electrode and an active pattern that forms a channel between the source electrode and the drain electrode. The active pattern includes a channel layer which may include amorphous silicon, poly silicon or an oxide semiconductor.

An oxide semiconductor has high electron mobility, and may be manufactured by a low temperature process, and easily manufactured on a large scale. Thus, research and development on oxide semiconductors is being actively conducted.

Recently, a solution process has been developed for manufacturing oxide semiconductors. The solution process may form a thin film selectively in a target area, and strict control of the processing conditions is not required as compared to conventional chemical vapor deposition methods. Thus, the process for manufacturing the oxide semiconductor may be simplified.

However, when using the solution process, impurities such as organic material in a thin film still need to be removed so that the oxide semiconductor manufactured by the solution process may have desired characteristics. Thus, an annealing process at high temperature needs to be further performed. Therefore, a high temperature annealing process must be used in addition to the low temperature solution process, and it is difficult to apply the solution process to a flexible substrate such as a plastic substrate that can be damaged by heating.

SUMMARY

A composition used for manufacturing an oxide semiconductor that can be formed using a low-temperature heat-treatment is provided.

A method of forming a thin film transistor substrate using the composition is also provided.

According to one aspect, a composition for manufacturing an oxide semiconductor includes a metal oxalate and a solvent.

The metal oxalate may include at least of zinc, tin, indium and gallium, which is combined with oxalate ion. The metal oxalate may form a complex compound with at least one of halogen acid, water, nitric acid, acetic acid, sulfuric acid, phosphoric acid, oxalic acid, perchloric acid and fluoboric acid.

The complex compound may be represented by following Chemical Formula 1.

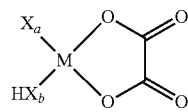
<Chemical Formula 1>

In Chemical Formula 1, M represents at least one of zinc, tin, indium and gallium; X represents at least one of a hydroxyl group, alkoxy group, halogen, nitrate, acetate ion, sulfate ion, phosphate ion, oxalate ion, perchlorate ion, chlorate ion, chlorine dioxide or tetrafluoroborate; HX is a molecule formed by hydrogen combined with at least one of hydroxyl group, alkoxy group, halogen, nitrate, acetate ion, sulfate ion, phosphate ion, oxalate ion, perchlorate ion, chlorate ion, chlorine dioxide or tetrafluoroborate. In Chemical Formula 1, "a" represents a value obtained from subtracting 2 from M's atomic value and "b" is an integral number from 1 to 4.

The complex compound may form at least one of a cluster, nanoparticle and sol-gel, which is represented by following Chemical Formula 2 or 3.

  <Chemical Formula 2>

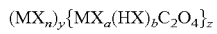  <Chemical Formula 3>

(M represents at least one of zinc, tin, indium and gallium; X represents at least one of a hydroxyl group, alkoxy group, halogen, nitrate, acetate ion, sulfate ion, phosphate ion, oxalate ion, perchlorate ion, chlorate ion, chlorine dioxide and tetrafluoroborate; HX is a molecule formed by hydrogen combined with at least one of hydroxyl group, alkoxy group, halogen, nitrate, acetate ion, sulfate ion, phosphate ion, oxalate ion, perchlorate ion, chlorate ion, chlorine dioxide and tetrafluoroborate; "a" represents a value obtained from subtracting 2 from M's atomic value; "b" is an integral number from 1 to 4; "n" is an integral number of M's atomic value of M; "x" is an integral number from 1 to 10; "y" is an integral number from 1 to 20; "z" is an integral number from 1 to 10; "MO" is an oxide of M; and "c" represents a value obtained from dividing an integral number of M's atomic value by 2.)

The solvent may include at least one of water, tetrahydrofuran, alcohol and ether.

The metallic salt may include at least one of a halide of zinc, tin, indium and gallium, and nitrate, alkoxide, hydroxide, acetate, sulfonate, phosphate, perchlorate and fluoborate. The oxalic acid compound may include oxalic acid.

The molarity of the metallic salt may be about 0.01M to about 1M. A mole fraction of an oxalic acid with respect to the metallic salt may be about 0.1 to about 10.

The composition for manufacturing an oxide semiconductor may further include a metallic salt of at least one of lithium(Li), sodium(Na), potassium(K), rubidium(Rb), cesium(Cs), beryllium(Be), magnesium(Mg), calcium(Ca), strontium(Sr), Aluminum(Al), barium(Ba), titanium(Ti), zirconium(Zr), hafnium(Hf), vanadium(V), yttrium(Y), niobium(Nb), tantalum(Ta), chromium(Cr), molybdenum(Mo), tungsten(W), manganese(Mn), technetium(Tc), rhenium(Re), iron(Fe), ruthenium(Ru), osmonium(Os), cobalt(Co), rhodium(Rh), iridium(Ir), nickel(Ni), palladium(Pd), platinum(Pt), copper(Cu), silver(Ag), gold(Au), cadmium(Cd), mercury(Hg), boron(B), gallium(Ga), indium(In), thallium (Tl), silicon(Si), germanium(Ge), tin(Sn), lead(Pb), phosphorus(P), arsenic(As), bismuth(Bi), lanthanum(La), cerium (Ce), gadolinium(Gd), neodymium(Nd), tellurium(Te), scandium(Sc), polonium(Po), praseodymium(Pr), terbium (Tb), dysprosium(Dy), holmium(Ho), europium(Eu), erbium (Er) and ytterbium(Yb).

The composition for manufacturing an oxide semiconductor may further include at least one solution stabilizer selected from the group monoethanolamine, diethanolamine, triethanolamine, monoisopropylamine, N,N-methylethanolamine, aminoethylethanolamine, diethyleneglycolamine, 2-(aminoethoxy) ethanol, N-t-butylethanolamine, N-t-butyldiethanolamine, tetramethylammonium hydroxide, methylamine, ethylamine, acetyl acetone, hydrochloric acid, nitric acid, sulfuric acid, acetic acid, ammonium hydroxide, potassium hydroxide and sodium hydroxide.

According to a method of manufacturing a thin film transistor substrate, a composition including a metal oxalate and a solvent is coated onto a substrate to form a thin film, the thin film is annealed, and the thin film is patterned to form a semiconductor pattern.

Annealing the thin film may be performed at about 100° C. to about 350° C.

The thin film may be irradiated with ultraviolet rays and the irradiation may occur before annealing the thin film.

The composition for manufacturing an oxide semiconductor may be coated onto the substrate by at least one of spin coating, dip coating, bar coating, screen printing, slide coating, roll coating, slit coating, spray coating, dipping, dip-pen, nano dispensing and printing inkjet.

According to a composition for manufacturing an oxide semiconductor and a method of manufacturing a thin film transistor substrate, an annealing process may be performed at relatively low temperatures by using a composition including a metal oxalate. Thus, application of such an oxide semiconductor to a plastic substrate may be easy, and by-products of manufacturing may be prevented.

BRIEF DESCRIPTION OF THE DRAWINGS

The above and other features and advantages will become more apparent by describing in detailed example embodiments thereof with reference to the accompanying drawings, in which.

DETAILED DESCRIPTION

Figure 1:
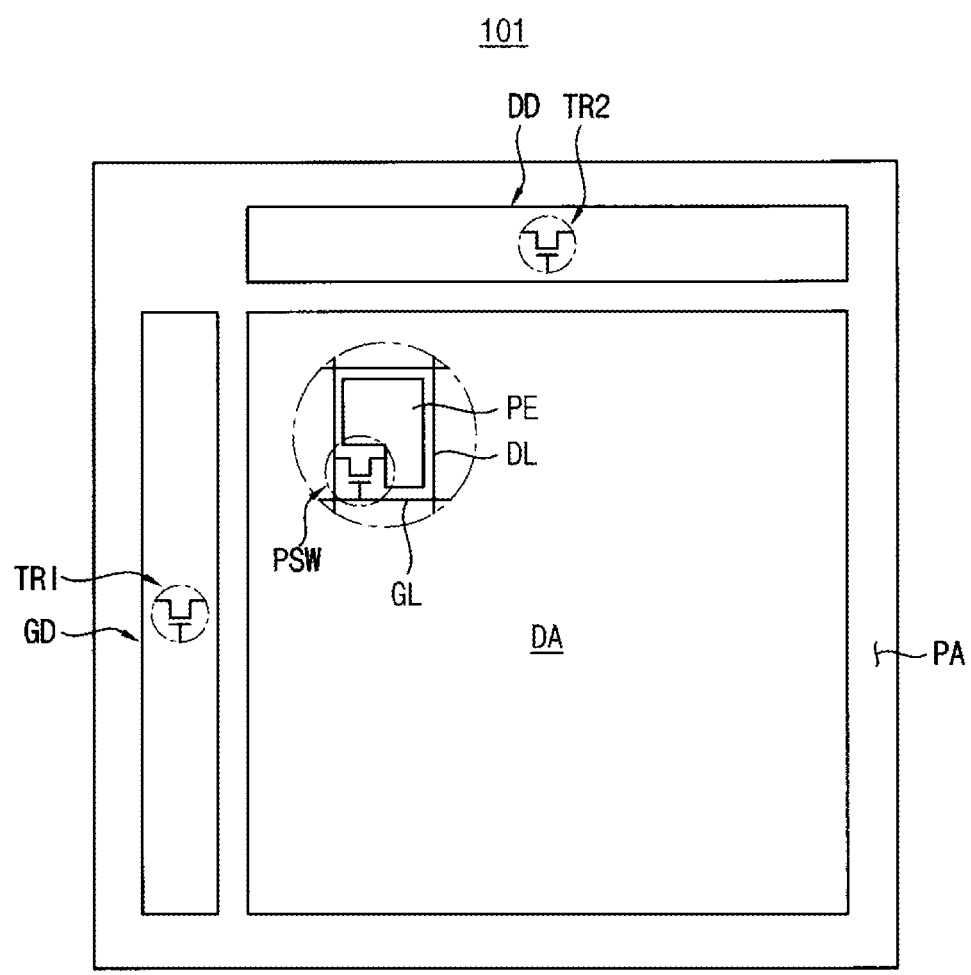
FIG. 1 is a plan view illustrating a display substrate manufactured according to an example embodiment.

Hereinafter, a composition for manufacturing an oxide semiconductor, a method of manufacturing a thin film transistor substrate and the result of an experiment with respect to the composition for manufacturing an oxide semiconductor will be described.

Composition for Manufacturing an Oxide Semiconductor

A composition for manufacturing an oxide semiconductor according to an example embodiment includes a metal oxalate and a solvent. The metal oxalate may be formed from a reaction between an oxalic acid compound and a metal ion in the solvent. Alternatively, the composition may be formed by dissolving the metal oxalate in the solvent.

The metal oxalate includes a metal combined with an oxalate ion. The metal in the metal oxalate may include, for example, zinc, tin, indium or gallium. In the process for forming the oxide semiconductor, the metal in the metal oxalate may also form a coordinate bond with, for example, halogen acid, hydrogen oxide, nitric acid, acetic acid, sulfuric acid, phosphoric acid, oxalic acid, perchloric acid or fluoboric acid that are present in the oxide semiconductor forming process to form a complex compound.

For example, such a complex compound is represented by following Chemical Formula 1.

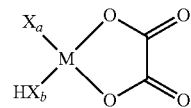

<Chemical Formula 1>

In the Chemical Formula 1, M represents the metal, for example zinc, tin, indium or gallium; X represents a hydroxyl group, alkoxy group, halogen, nitrate, acetate ion, sulfate ion, phosphate ion, oxalate ion, perchlorate ion, chlorate ion, chlorine dioxide or tetrafluoroborate; and HX is a molecule formed by hydrogen combined with a hydroxyl group, alkoxy group, halogen, nitrate($NO_3$), acetate ion($CH_3COO$), sulfate ion($SO_4$), phosphate ion($PO_4$), oxalate ion($C_2O_4$), perchlorate ion($ClO_4$), chlorate ion($ClO_3$), chlorine dioxide($ClO_2$) or tetrafluoroborate($BF_4$). In Chemical Formula 1 "a" represents a value obtained from subtracting 2 from atomic value of M, and "b" is an integral number from 1 to 4.

In forming Chemical Formula 1, the "X" may be supplied from another component in the composition. For example, the "X" may be formed from an anion of a metallic salt that combines with the metal cation of the metal oxalate. Furthermore, the HX in Chemical Formula 1, is a molecule formed by a combination of an anion of a metallic salt and a hydrogen atom. To form the complex compound of Chemical Formula 1 to include the HX, the metal cation of the metal oxalate is combined with the HX molecule.

In an example embodiment, the metal oxalate may be formed from the reaction of a metal ion with an oxalic acid dissolved in a solution. Thus, a composition for manufacturing an oxide semiconductor may include an oxalic acid compound, a metallic salt and a solvent.

The oxalic acid compound may include any compound that may be ionized in the solvent to provide an oxalate ion. Examples of the oxalic acid compound may include an oxalic acid, a sodium oxalate, and etc.

Examples of the metallic salt may include a zinc-containing compound, a tin-containing compound, an indium-containing compound, a gallium-containing compound and etc. Particularly, examples of the metallic salt may include a halide of zinc, tin, indium or gallium, and nitrate, alkoxide, hydroxide, acetate, sulfonate, phosphate, perchlorate, oxalate, fluoborate and etc. These can be used alone or in a combination thereof.

Particularly, examples of the indium-containing compound may include indium acetyl acetonate, indium acetate, indium chloride, indium isopropoxide and etc. Examples of the zinc-containing compound may include zinc acetate, zinc nitrate, zinc acetylacetonate, zinc chloride and etc. Examples of the tin-containing compound may include tin acetylacetonate, tin acetate, tin chloride, tin isopropoxide and etc. Examples of the gallium-containing compound may include gallium acetyl acetonate, gallium acetate, gallium isopropoxide and etc.

When metallic salts are used to from oxide semiconductors, the metal form the metallic salt is a component remaining in the semiconductor. The metallic salt is ionized in a solution to generate halogen ion, nitrate ion, or acetate ion. Conventionally, an annealing process is necessary to remove these ions. Thus, the conventional process for forming an oxide semiconductor requires a high temperature annealing process, and is thus not entirely a low temperature process, and by-products such as hydrochloric acid, nitric acid and acetic acid may be formed thereby causing environmental problems. On the other hand, the composition for manufacturing an oxide semiconductor of the embodiments forms a metal oxalate, and the ions—halogen ion, nitrate ion, or acetate ion—may be combined with the metal oxalate. Thus, the above-mentioned problems with the conventional process may be solved.

The metal oxalate is combined with other component of the composition, so that a cluster, nanoparticle or sol-gel may be formed. For example, the cluster, the nanoparticle or the sol-gel are represented by following Chemical Formula 2 or 3.

$$(MO_c)_x(MX_n)_y\{MX_a(HX)_bC_2O_4\}_z$$ <Chemical Formula 2>

$$(MX_n)_y\{MX_a(HX)_bC_2O_4\}_z$$ <Chemical Formula 3>

In the Chemical Formulas 2 and 3, M represents zinc, tin, indium or gallium; X represents hydroxyl group, alkoxy group, halogen, nitrate, acetate ion, sulfate ion, phosphate ion, oxalate ion, perchlorate ion, chlorate ion, chlorine dioxide or tetrafluoroborate; and HX is a molecule formed by hydrogen combined with hydroxyl group, alkoxy group, halogen, nitrate, acetate ion, sulfate ion, phosphate ion, oxalate ion, perchlorate ion, chlorate ion, chlorine dioxide or tetrafluoroborate. In Chemical Formulas 2 and 3 "a" represents a value obtained from subtracting 2 from atomic value of M, and "b" is an integral number from 1 to 4. Additionally, "n" is an integral number of the atomic value of M, "x" is an integral number from 1 to 10, "y" is an integral number from 1 to 20, "z" is an integral number from 1 to 10, "MO" is an oxide of M, and "c" represents a value obtained from dividing an integral number of atomic value of M by 2.

In the Chemical Formulas 2 and 3, a metallic salt ($MX_n$), a metallic oxide ($MO_c$) and a metal oxalate ($\{MX_a(HX)_b C_2O_4\}_z$) may be combined with each other via an ionic bond, a coordinate bond and van der Waals forces.

For example, when the composition includes oxalic acid and indium chloride ($InCl_3$), the oxalic acid and the indium chloride reacts to form $InClC_2O_4$ (indium oxalate). $InClC_2O_4$ additionally reacts with remaining indium chloride to form a cluster of $(InCl_3)(InClC_2O_4)$. Also, indium chloride is hydrolyzed to form indium hydroxide (InOH), which forms indium oxide through a condensation reaction. The indium oxide reacts with $(InCl_3)(InClC_2O_4)$ to form a cluster of $(In_2O_3)(InCl_3)(InClC_2O_4)$.

The metallic salt may further include an additional metallic salt having a different metal from a zinc-containing compound, a tin-containing compound, an indium-containing compound or a gallium-containing compound. For example, the additional metallic salt may include halide, nitrate, alkoxide, hydroxide, acetate, sulfonate, phosphate, perchlorate, or fluoborate, each of those including, for example, lithium(Li), sodium(Na), potassium(K), rubidium(Rb), cesium(Cs), beryllium(Be), magnesium(Mg), calcium(Ca), strontium(Sr), aluminum(Al), barium(Ba), titanium(Ti), zirconium(Zr), hafnium(Hf), vanadium(V), yttrium(Y), niobium(Nb), tantalum(Ta), chromium(Cr), molybdenum(Mo), tungsten(W), manganese(Mn), technetium(Tc), rhenium(Re), iron(Fe), ruthenium(Ru), osmonium(Os), cobalt(Co), rhodium(Rh), iridium(Ir), nickel(Ni), palladium(Pd), platinum(Pt), copper(Cu), silver(Ag), gold(Au), cadmium(Cd), mercury(Hg), boron(B), gallium(Ga), indium(In), thallium(Tl), silicon(Si), germanium(Ge), tin(Sn), lead(Pb), phosphorus(P), arsenic(As), bismuth(Bi), lanthanum(La), cerium(Ce), gadolinium(Gd), Neodymium(Nd), Tellurium(Te), Scandium(Sc), Polonium(Po), Praseodymium(Pr), Terbium(Tb), Dysprosium(Dy), Holmium(Ho), Europium(Eu), Erbium(Er) or Ytterbium(Yb). These can be used alone or in a combination thereof. The additional metallic salt may be properly selected depending on the oxide semiconductor desired.

Examples of the solvent may include water ($H_2O$), tetrahydrofuran (THF), alcohol and ether.

Examples of the alcohol may include methanol, ethanol, propanol, isopropanol, 2-methoxyethanol, 2-ethoxyethanol, 2-propoxyethanol, 2-butoxyethanol, methyl cellosolve, ethyl cellosolve, diethylene glycol methyl ether, diethylene glycol ethyl ether, dipropylene glycol methyl ether, toluene, xylene, hexane, heptane, octane, ethyl acetate, butyl acetate, diethylene glycol dimethyl ether, diethylene glycol dimethylethyl ether, methylmethoxy propionic acid, ethylethoxy propionic acid, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethylformamide(DMF), N,N-dimethylacetamide(DMAC), N-methyl-2-pyrrolidone, γ-butyrolactone, diethylether, ethyl glycol dimethyl ether, digylme, tetrahydrofuran, acethyl acetone, acetonitrile, and etc. These can be used alone or in a combination thereof.

The composition for manufacturing an oxide semiconductor may further include a solution stabilizer.

The solution stabilizer may include at least one of an alcohol amine compound, an alkyl ammonium hydroxyl compound, an alkyl amine compound, a ketone compound, acid compound, base compound, and etc. Examples of the solution stabilizer may include at least one of monoethanolamine, diethanolamine, triethanolamine, monoisopropylamine, N,N-methylethanolamine, amino ethylethanolamine, diethyleneglycolamine, 2-(aminoethoxy)ethanol, N-t-butylethanolamine, N-t-butyldiethanolamine, tetramethylammonium hydroxide, methylamine, ethylamine, acetyl acetone, hydrochloric acid, nitric acid, sulfuric acid, acetic acid, ammonium hydroxide, potassium hydroxide and sodium hydroxide.

The solution stabilizer serves to increase solubility of other components, so that a uniform thin film may be formed. The amount of the solution stabilizer used in the composition may be varied, depending upon kind and amount of other components. For example, amount of the solution stabilizer may be about 0.01% by weight to about 30% by weight based on the total weight of the composition for manufacturing an oxide semiconductor. The solution stabilizer may serve to increase solubility and coating ability of a thin film in the above range.

For example, concentration of the metal salts may be in a range of about 0.001 M to about 10 M. However, when concentration of the metallic salt is less than about 0.01M, a thin film having uniform thickness is difficult to form. When concentration of the composition is greater than about 1M, solubility is decreased, so crystal may occur. Thus, concentration of the metallic salt may also be in a range of about 0.01 M to about 1 M.

Mole fraction of the oxalic acid with respect to the metallic salt may be in a range of about 0.1 to about 10. When the mole fraction of the oxalic acid with respect to the metallic salt is less than about 0.1, the amount of the metal oxalate is smaller than the amount of anion formed due to the metallic salt. Thus, the anion formed from the metallic salt is not sufficiently combined with the metal oxalate and free anion may remain. When mole fraction of the oxalic acid with respect to the metallic salt is greater than about 10, the metallic salt may not be uniformly dissolved in the composition. For example, concentration of the oxalic acid may be about 0.001M to about 10M.

In an example embodiment, the composition for manufacturing an oxide semiconductor may include an oxalic acid providing an oxalate ion and a metallic salt providing a metal ion to form the metal oxalate.

Alternatively, a metal oxalate is dissolved in a solvent to form a composition for manufacturing an oxide semiconductor according to an example embodiment.

Examples of the metal oxalate used to form the complex compound may include an indium oxalate such as $InClC_2O_4$, a zinc oxalate such as $ZnC_2O_4$, a tin oxalate such as $SnC_2O_4$, a gallium oxalate such as $Ga_2(C_2O_4)_3$, hydrates thereof, and etc.

The composition for manufacturing an oxide semiconductor may further include an additional metallic salt, a solvent, a solution stabilizer, and etc., as described above.

According to an example embodiment, halogen anions, nitrate ions and acetate ions, which are formed due to the metallic salt in the composition, are combined with the metal oxalate. Thus, an annealing process may be performed only at a low temperature, and by-products that may cause environmental pollution may be prevented.

Hereinafter, a method of manufacturing a thin film transistor substrate will be described in detail with reference to the accompanying drawings.

Method of Manufacturing a Thin Film Transistor Substrate

FIG. 1 is a plan view illustrating a thin film transistor substrate according to an example embodiment. In an example embodiment, the thin film transistor substrate is a display substrate used for manufacturing a display panel.

Referring to FIG. 1, a display substrate 101 may include a pixel part formed in a display area DA, a gate driver GD and a data driver DD formed in a peripheral area of the display area DA.

The pixel part may include a pixel transistor PSW and a pixel electrode PE, which is electrically connected to the pixel transistor PSW. The pixel transistor PSW may be electrically connected to a gate line GL and a data line DL formed in the display area DA. The gate driver GD provides a gate driving signal to the pixel part, and includes a plurality of first circuit transistors TR1. The data driver DD provides a data driving signal to the pixel part, and includes a plurality of second circuit transistors TR2. The pixel transistor PSW is a thin film transistor (TFT), and each of the first circuit transistors TR1 and the second circuit transistors TR2 is a thin film transistor (TFT).

Hereinafter, referring to FIGS. 2 and 3, the pixel transistor PSW and the first and second circuit transistors TR1 and TR2 will be described in detail. A constitution of the second circuit transistor TR2 is identical to the first circuit transistor TR1 except for signal lines connected to the second circuit transistor TR2. Thus, the description of the first circuit transistor TR1 also describes the second circuit transistor TR2, and a description of the second circuit transistor TR2 is omitted.

Figure 2:
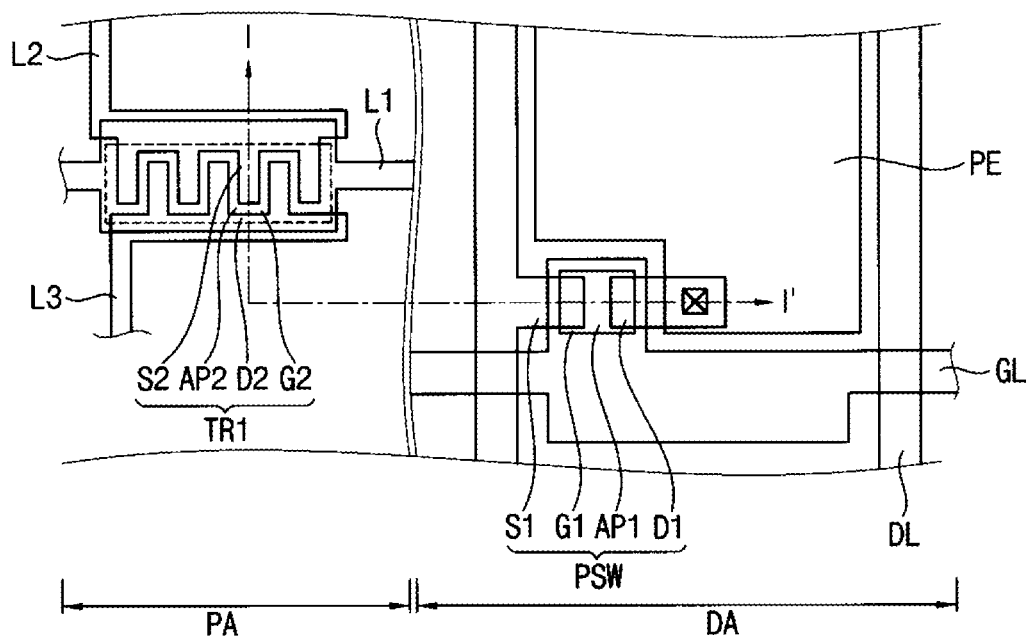
FIG. 2 is an enlarged view illustrating a circuit transistor and a pixel transistor in FIG. 1.

FIG. 2 is an enlarged view illustrating the circuit transistor and the pixel transistor illustrated in FIG. 1. FIG. 3 is a cross-sectional view taken along the line I-I' of FIG. 2.

Figure 3:
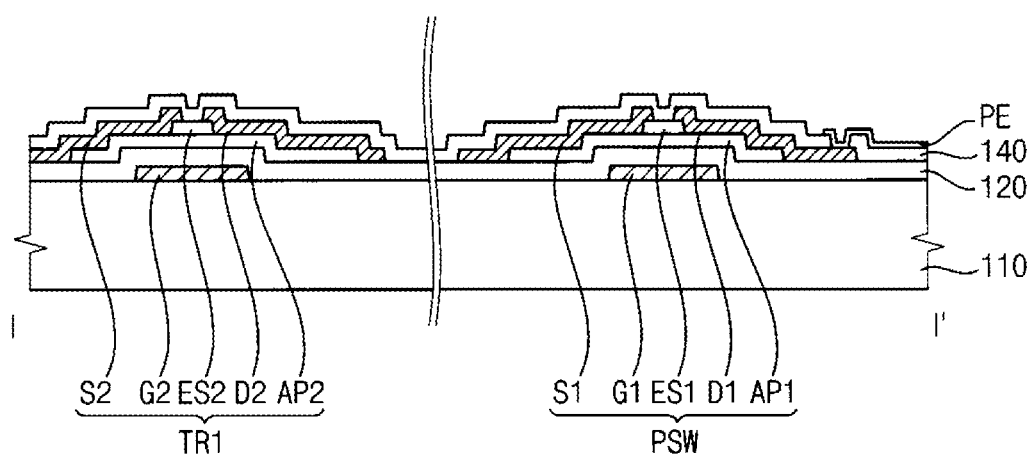
FIG. 3 is a cross-sectional view taken along a line I-I' of FIG. 2.

Referring to FIGS. 2 and 3, the pixel transistor PSW may include a pixel gate electrode G1 connected with the gate line GL, a pixel source electrode S1 connected with the data line DL, a pixel drain electrode D1 spaced apart from the pixel source electrode S1 and a first semiconductor pattern AP1.

The first semiconductor pattern AP1 is overlapped with the pixel gate electrode G1, and is disposed on the pixel gate electrode G1. The first semiconductor pattern AP1 includes, for example, zinc oxide, tin oxide, indium oxide or gallium oxide. Also, the first semiconductor pattern AP1 may include an oxide semiconductor of multi-component such as, for example, indium-zinc oxide, indium-zinc-tin oxide, and etc.

The first semiconductor AP1 may further include, for example, a dopant such as lithium(Li), sodium(Na), potassium(K), rubidium(Rb), cesium(Cs), beryllium(Be), magnesium(Mg), calcium(Ca), strontium(Sr), Aluminum(Al), barium(Ba), titanium(Ti), zirconium(Zr), hafnium(Hf), vanadium(V), yttrium(Y), niobium(Nb), tantalum(Ta), chromium(Cr), molybdenum(Mo), tungsten(W), manganese (Mn), technetium(Tc), rhenium(Re), iron(Fe), ruthenium (Ru), osmonium(Os), cobalt(Co), rhodium(Rh), iridium(Ir), nickel(Ni), palladium(Pd), platinum(Pt), copper(Cu), silver (Ag), gold(Au), cadmium(Cd), mercury(Hg), boron(B), gallium(Ga), indium(In), thallium(Tl), silicon(Si), germanium (Ge), tin(Sn), lead(Pb), phosphorus(P), arsenic(As), bismuth (Bi), lanthanum(La), cerium(Ce), gadolinium(Gd), Neodymium(Nd), Tellurium(Te), Scandium(Sc), Polonium (Po), Praseodymium(Pr), Terbium(Tb), Dysprosium(Dy), Holmium(Ho), Europium(Eu), Erbium(Er) or Ytterbium (Yb). These can be used alone or in a combination thereof.

Each of the pixel source electrode S1 and the pixel drain electrode D1 may be formed on the first semiconductor pattern AP1. Because the first semiconductor pattern AP1 may be damaged by an etchant and/or a strip solution in a process of forming the pixel source electrode S1 and the pixel drain electrode D1, a first etch stopper ES1 is formed on the first semiconductor pattern AP1, to prevent the first semiconductor pattern AP1 from being exposed through a gap between the pixel source electrode S1 and the pixel drain electrode D1. Thus, the pixel source electrode S1 and the pixel drain electrode D1 may be partially formed on the first etch stopper ES1. However, the first etch stopper ES1 may be omitted depending on the constitution and a forming process of an oxide semiconductor.

The pixel source electrode S1 may be overlapped with a first end portion of the first semiconductor pattern AP1, and the pixel drain electrode D1 may be overlapped with a second end portion of the second semiconductor pattern AP2. A contact resistance between the first semiconductor pattern AP1 and the pixel source electrode S1, and between the first semiconductor pattern AP1 and the pixel drain electrode D1, is lower than when the first semiconductor pattern AP1 has an amorphous silicon semiconductor. Thus, an ohmic contact layer is not formed in an example embodiment. However, an additional ohmic contact layer may be formed to minimize a contact resistance in another example embodiment (not illustrated).

The pixel drain electrode D1 makes contact with the pixel electrode PE, so that the pixel transistor PSW is electrically connected with the pixel electrode PE.

The first circuit transistor TR1 may include a circuit gate electrode G2 connected to a control signal line L1, a circuit source electrode S2 connected to an input signal line L2, a circuit drain electrode D2 connected to an output signal line L3, a second semiconductor pattern AP2 and a second etch stopper ES2, which partially covers the second semiconductor pattern AP2. The second semiconductor pattern AP2 is formed from the same layer as the first semiconductor pattern AP1. The second semiconductor pattern AP2 may be formed in a same process as the first semiconductor pattern AP1. The first circuit transistor TR1 is essentially the same as the pixel transistor PSW except for the signal lines connected thereto and except for being formed in the peripheral area PA of the display substrate 101. Thus, repetitive description will be omitted.

The display substrate 101 may further include a gate insulation layer 120 and a passivation layer 140. The gate insulation layer 120 is formed on a base substrate 110 including the pixel gate electrode G1 and the circuit gate electrode G2.

The gate insulation layer 120 may include a nitride layer and/or an oxide layer. The passivation layer 140 may be formed on the pixel source and the drain electrodes S1 and D1, and the circuit source and drain electrodes S2 and D2. The passivation layer 140 may include a nitride layer and/or an oxide layer.

The pixel electrode PE is formed on the passivation layer 140. The pixel electrode PE makes direct contact with the pixel drain electrode D1 through a contact hole formed through the passivation layer 140.

Although not illustrate, a buffer layer may be formed between each of the pixel gate electrodes G1, the circuit gate electrodes G2 and the base substrate 110. The buffer layer serves to improve adhesive strength between the pixel transistor PSW, the first circuit transistor TR1 and the base substrate 110.

FIGS. 4A to 4E are cross-sectional views illustrating a method of manufacturing the thin film transistor substrate illustrated in FIG. 3.

Figure 4A:
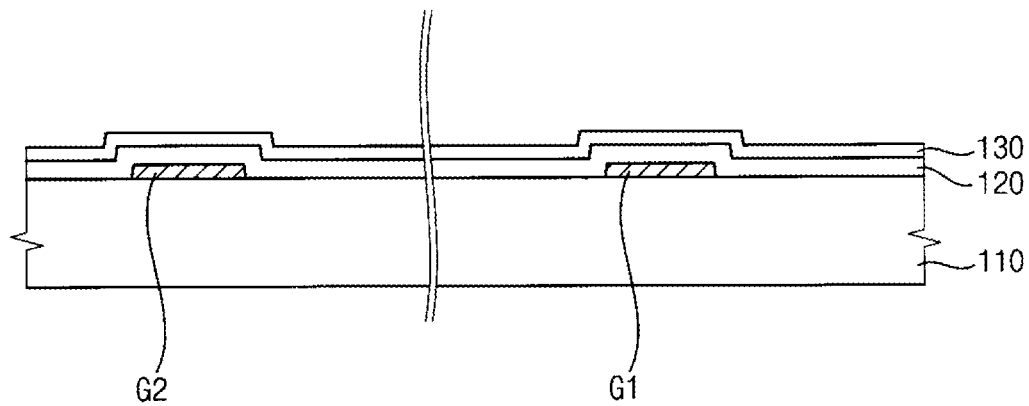
FIGS. 4A to 4E are a cross-sectional view illustrating a method of manufacturing a thin film transistor substrate in FIG. 3.

Referring to FIG. 4A, the pixel gate electrode G1 and the circuit gate electrode G2 are formed on the base substrate 110. Examples of the base substrate 110 may include a glass substrate, a soda-lime substrate, a flexible plastic, and etc.

The gate insulation layer 120 is formed on the base substrate 110 where the pixel gate electrode G1 and the circuit gate electrode G2 are formed. Thereafter, a composition for manufacturing an oxide semiconductor is coated on the gate insulation layer 120 to form a semiconductor layer 130.

The composition for manufacturing an oxide semiconductor may include a metal oxalate and a solvent. The metal oxalate serves to form a complex compound in the composition. The complex compound is represented by following Chemical Formula 1.

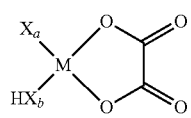

<Chemical Formula 1>

In the Chemical Formula 1, M represents the metal, for example zinc, tin, indium and gallium; X represents a hydroxyl group, alkoxy group, halogen, nitrate, acetate ion, sulfate ion, phosphate ion, oxalate ion, perchlorate ion, chlorate ion, chlorine dioxide or tetrafluoroborate; and HX is a molecule formed by hydrogen combined with a hydroxyl group, alkoxy group, halogen, nitrate, acetate ion, sulfate ion, phosphate ion, oxalate ion, perchlorate ion, chlorate ion, chlorine dioxide or tetrafluoroborate. In Chemical Formula 1, "a" represents a value obtained from subtracting 2 from atomic value of M, and "b" is an integral number from 1 to 4.

In an example embodiment, the metal oxalate is formed from reaction of metal ion with oxalic acid dissolved in a solvent. Thus, the composition may include an oxalic acid compound, a metallic salt and a solvent.

The composition is substantially the same as the above composition for manufacturing an oxide semiconductor, thus repetitive description will be omitted.

Any one of numerous coating methods may be used to coat the composition onto the substrate. Examples of coating methods that may be used include spin coating, dip coating, bar coating, screen printing, slide coating, roll coating, slit coating, spray coating, dipping, dip-pen, nano dispensing, or printing inkjet, and etc.

In an example embodiment, the composition for manufacturing the oxide semiconductor is coated to form a thin film, and the thin film is then irradiated with an ultraviolet ray.

Irradiating the thin film with ultraviolet rays promotes decomposition of carbon-oxygen combination of metal oxalate in the thin film, so that an annealing temperature of the thin film may be lowered. Ultraviolet radiation used to irradiate the thin film may have a wavelength which is from about 350 nm to about 150 nm.

After irradiating with ultraviolet rays, the thin film is heat-treated, for an annealing process. Thus, the semiconductor layer 130 including an oxide semiconductor is formed.

In an example embodiment, the annealing temperature may be from about 100° C. to about 500° C. The annealing temperature may also be from about 100° C. to about 350° C., which is substantially lower than a conventional annealing temperature (more than about 450° C.) in a solution process for forming an oxide semiconductor.

Figure 4B:
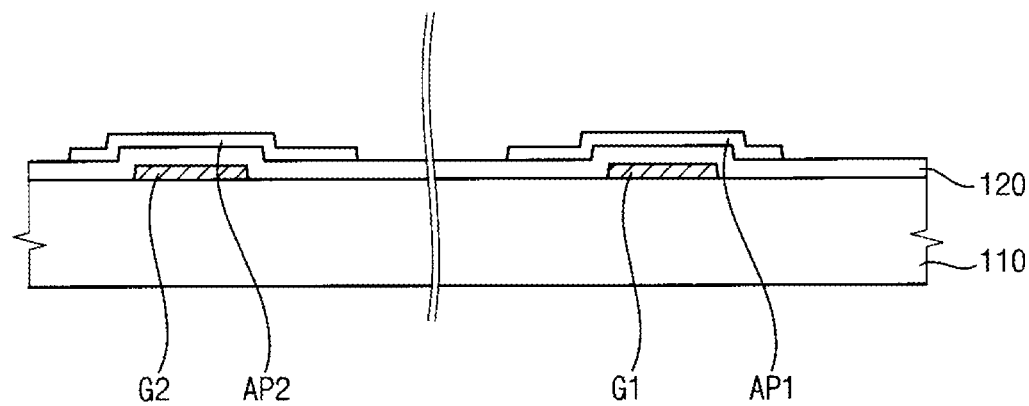

Referring to FIG. 4B, the semiconductor layer 130 is patterned to form the first and second semiconductor patterns AP1 and AP2. For example, the semiconductor layer 130 may be patterned by a photolithography process. The first semiconductor pattern AP1 is overlapped with the pixel gate electrode G1, and the second semiconductor pattern AP2 is overlapped with the circuit gate electrode G2.

Figure 4C:
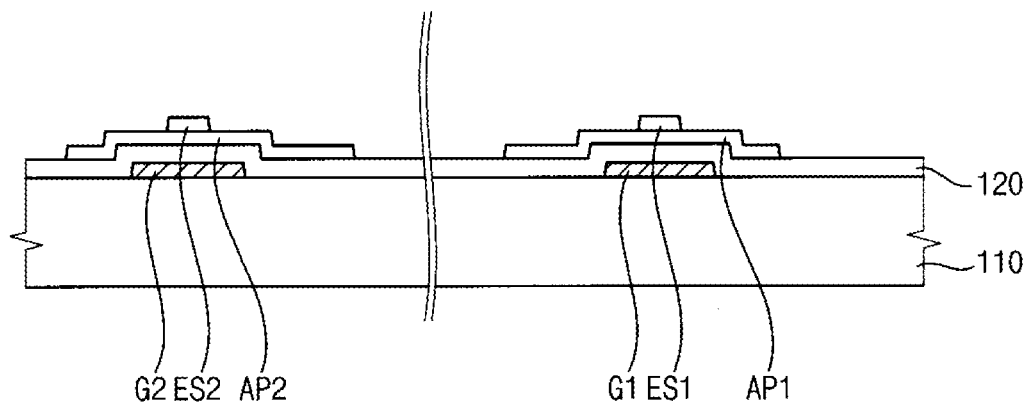

Referring to FIG. 4C, the first and second etch stoppers ES1, ES2 are formed to partially cover the first and second semiconductor patterns AP1 and AP2. Thus, the first and second semiconductor patterns AP1 and AP2 exposed through a gap between source and drain electrodes are covered, and damage to the first and second semiconductor patterns AP1 and AP2 is prevented. The first and second etch stoppers ES1, ES2 may include, for example, silicon oxide, silicon nitride, silicon oxynitride, and etc.

Figure 4D:
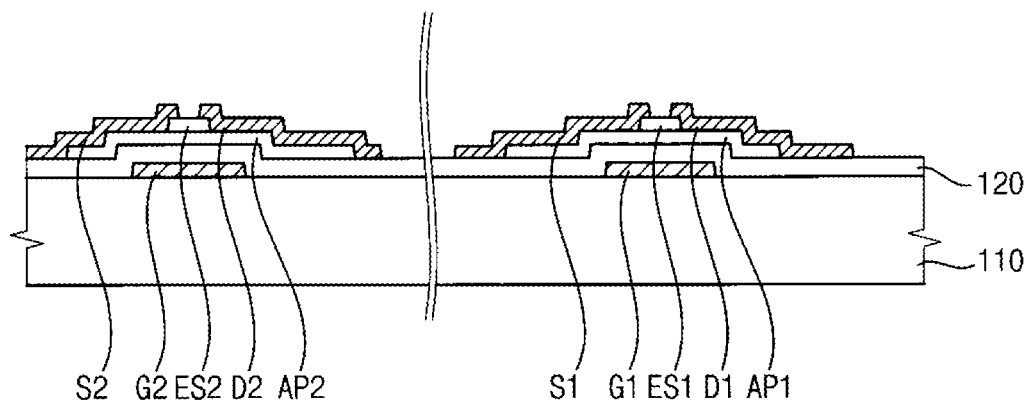

Referring to FIG. 4D, the pixel source and drain electrodes S1 and D1, and the circuit source and drain electrodes S2 and D2 are formed on the base substrate 110 including the first and second semiconductor patterns AP1 and AP2. Thus, the pixel transistor PSW and the first circuit transistor TR1 may be manufactured.

The pixel source and drain electrodes S1 and D1, and the circuit source and drain electrodes S2 and D2, are formed by patterning a data metal film. The data metal film may include a main-line metal film including, for example, molybdenum, copper or aluminium. These can be used alone or in a combination thereof. The data metal film may further include a buffer metal film disposed between the main-line metal film, an upper film and/or a lower film. For example, a molybdenum film may be used for the main-line metal film of the data metal film, or a copper film may be used for the main-line metal film of the data metal film with a titanium film under the copper film. Alternatively, an aluminum film is used for the main-line metal film of the data metal film with a buffer metal film including a molybdenum film, which makes contact with an upper surface and/or a lower surface of the aluminum film. The buffer metal film may serve as an ohmic contact layer between the semiconductor patterns AP1 and AP2 and the main-line metal film.

Figure 4E:
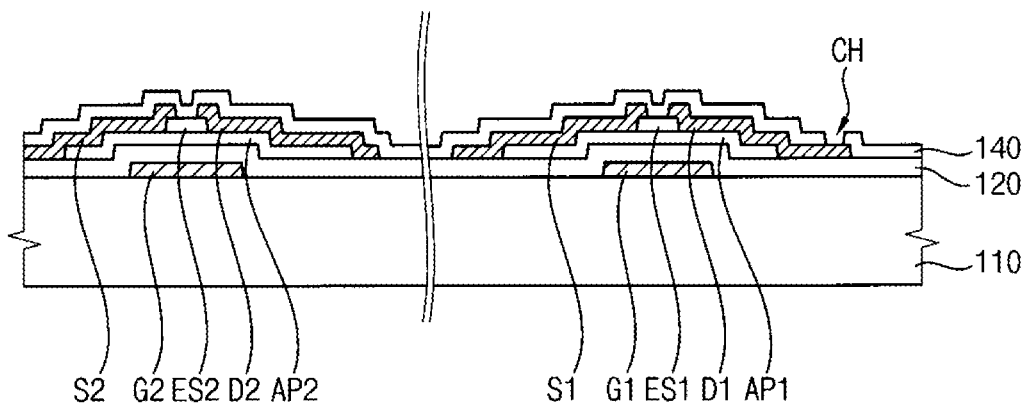

Referring to FIG. 3 and FIG. 4E, the passivation layer 140 is formed on the base substrate 110 including the pixel source and drain electrodes S1 and D1, and the circuit source and drain electrode S2 and D2. A portion of the passivation layer 140 is removed to form the contact hole CH, and the pixel electrode PE is formed on the passivation layer 140 where the contact hole is formed. Thus, the display substrate illustrated in FIGS. 1 to 3 may be manufactured.

According to an example embodiment, an annealing process used to form the oxide semiconductor may be performed at a low temperature by using the composition including a metal oxalate. Thus, the annealing process may be easily applied to a plastic substrate, and by-products that may cause environmental pollution may be prevented.

Furthermore, an ultraviolet ray is irradiated to a thin film formed by coating the composition before an annealing process, so that an annealing temperature may be further lowered.

Hereinafter, an effect of an example embodiment will be explained with reference to experimental results of examples of a composition of for manufacturing and oxide semiconductor, and a thin film transistor formed by using the composition.

Example 1

Indium chloride ($InCl_3$) and oxalic acid were mixed with 2-methoxyethanol so that indium chloride had concentration of about 0.1 M and oxalic acid had a concentration of about 0.06 M. The mixture was stirred for 1 hour to prepare a composition for manufacturing an oxide semiconductor.

Example 2

The composition for manufacturing an oxide semiconductor in Example 1 was spin-coated (2000 rpm, 20 sec) onto a substrate that included a gate electrode formed from silicon heavily-doped with P-type impurities and a silicon oxide insulator film, which had a thickness of about 1000 Å and covered the gate electrode. Thus, a thin film was formed. Thereafter, an annealing process was performed by heating the substrate on a hot plate at about 250° C. in the atmosphere for about 1 hour. Thus, an indium oxide semiconductor layer was formed. A source electrode and a drain electrode including aluminum were formed by using electron beam evaporation on the oxide semiconductor layer. Thus a thin film transistor (TFT) was prepared.

Example 3

A thin film transistor was prepared using the same method as described in Example 2, but, before the annealing process, the thin film was irradiated for about 20 minutes using an ultraviolet ray having about 254 nm of main-wavelength and about 185 nm of sub-wavelength.

Example 4

A thin film transistor was prepared using the same method as described in Example 2, but, before the annealing process, the thin film was irradiated for about 45 minutes using an ultraviolet ray including about 254 nm of main-wavelength and about 185 nm of sub-wavelength.

Example 5

Indium chloride ($InCl_3$), oxalic acid, zinc nitrate ($Zn(NO_3)_2$) and tin chloride ($SnCl_2$) were mixed with 2-methoxyethanol so that indium chloride had a concentration of about 0.3 M, oxalic acid had a concentration of about 0.06 M, zinc nitrate ($Zn(NO_3)2$) had a concentration of about 0.13 M and tin chloride ($SnCl_2$) had a concentration of about 0.13 M. The mixture was stirred for about 1 hour to prepare a composition for manufacturing an oxide semiconductor.

Example 6

The composition for manufacturing an oxide semiconductor prepared as in Example 5 was spin-coated (2000 rpm, 20 sec) onto a substrate that included a gate electrode formed from silicon heavily-doped with P-type impurities and a silicon oxide insulator film, which had a thickness of about 1000 Å and covered the gate electrode. Thus, a thin film was formed. Thereafter, an annealing process was performed by heating the substrate on a hot plate at about 350° C. in the atmosphere for about 1 hour. Thus, an indium-zinc-tin oxide semiconductor layer was formed. A source electrode and a drain electrode including aluminum were formed by using electron beam evaporation on the oxide semiconductor layer. Thus a thin film transistor (TFT) was prepared.

Example 7

A thin film transistor was prepared through a same method as Example 6, but, before the annealing process, the thin film was irradiated for about 20 minutes using an ultraviolet ray including about 254 nm of main-wavelength and about 185 nm of sub-wavelength.

Example 8

A thin film transistor was prepared through a same method as Example 6, but, before the annealing process, the thin film was irradiated for about 60 minutes using an ultraviolet ray including about 254 nm of main-wavelength and about 185 nm of sub-wavelength.

Current Characteristics Experiment of Thin Film Transistor

Figure 5:
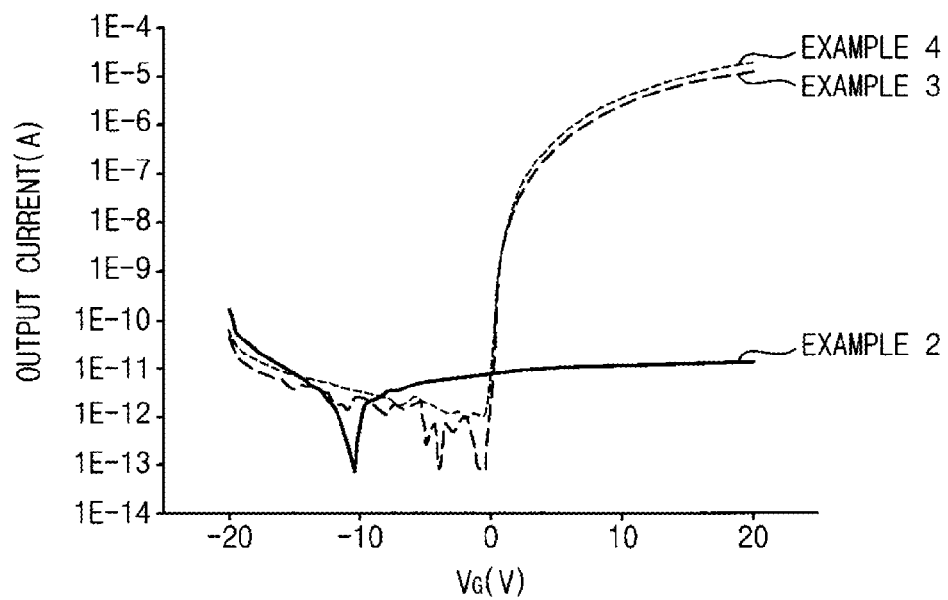
FIG. 5 is a graph illustrating a relationship between a output current and a gate voltage of a thin film transistor in Examples 2 to 4 of the present disclosure.
Figure 6:
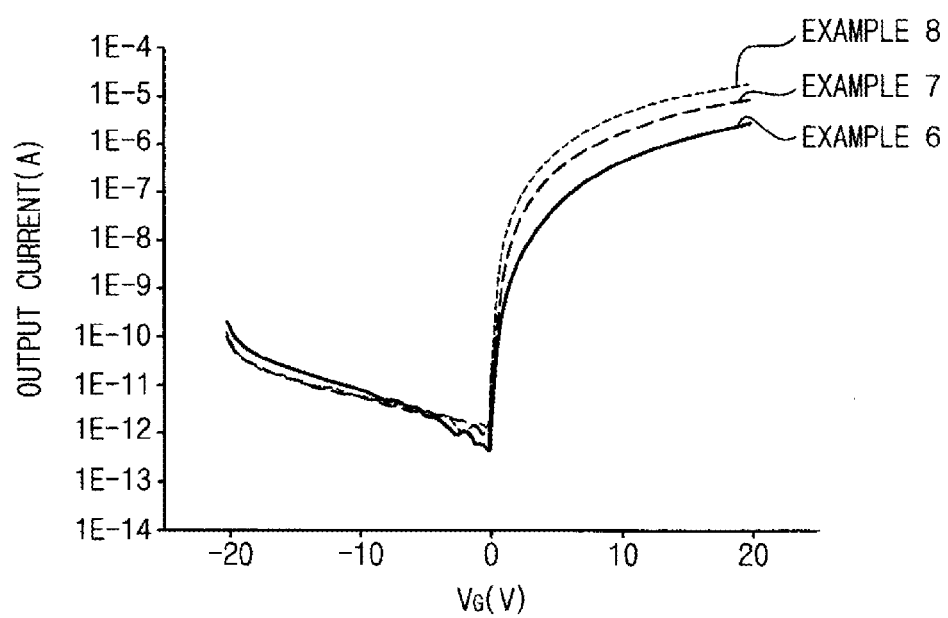
FIG. 6 is a graph illustrating a relationship between an output current and a gate voltage of a thin film transistor in Examples 6 to 8 of the present disclosure.

FIG. 5 is a graph illustrating a relationship between an output current and a gate voltage of the thin film transistors in Examples 2 to 4 of the present disclosure. FIG. 6 is a graph illustrating a relationship between an output current and a gate voltage of a thin film transistor in Examples 6 to 8 of the present disclosure. About 10V of voltage was applied to source electrodes of the thin film transistors in Examples 2 to 4 and 6 to 8. The gate voltage applied to a gate electrode was changed from about −20V to about 20V, and the change of output current was measured.

Referring to FIG. 5, a thin film transistor formed by irradiating the oxide semiconductor with ultraviolet rays before an annealing process in Examples 3 and 4 is turned on at about 0V. Due to the irradiation, the annealing process may be performed at about 250° C., which is lower than the annealing process temperature used in conventional methods.

Referring to FIG. 6, a thin film transistor that included the indium-zinc-tin oxide semiconductor layer formed as described in Examples 7 to 8 is capable of being annealed at about 350° C., which is also lower than the annealing temperature used in conventional methods. Furthermore, the thin film transistor formed without irradiation with ultraviolet rays described in Example 6 is capable of being annealed at a same temperature. Thus, the annealing temperature may be lowered by using a composition for manufacturing an oxide semiconductor of the present disclosure.

Referring to FIGS. 5 and 6, generally the longer irradiation time, the more the current characteristics increased. Thus, it can be noted that irradiating with ultraviolet rays serves to decompose impurities in the semiconductor layer to substantially improve the effect of annealing.

The composition for manufacturing an oxide semiconductor according to example embodiments may be used for manufacturing a thin film transistor and a display apparatus such as a liquid crystal display apparatus and an organic electro luminescence display apparatus, and etc.

The foregoing is illustrative and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present disclosure, including the claims. In the claims, means-plus-function clauses are intended to cover the structures described herein as performing the recited function and not only structural equivalents but also equivalent structures. Therefore, it is to be understood that the foregoing is illustrative and is not to be construed as limited to the specific example embodiments disclosed, and that modifications to the disclosed example embodiments, as well as other example embodiments, are intended to be included within the scope of the disclosure, including the appended claims.

What is claimed is:

1. A method of manufacturing a thin film transistor substrate comprising a gate electrode, a semiconductor pattern, a source electrode and a drain electrode, the method comprising:
    coating a composition comprising a metal oxalate and a solvent on a substrate to form a thin film on the substrate;
    annealing the thin film; and
    patterning the thin film to form a semiconductor pattern,
    wherein the metal oxalate is represented by following Chemical Formula 1,

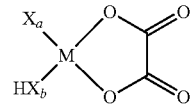

<Chemical Formula 1> wherein M represents at least one of zinc, tin, indium and gallium; X represents at least one of hydroxyl group, alkoxy group, halogen, nitrate, acetate ion, sulfate ion, phosphate ion, oxalate ion, perchlorate ion, chlorate ion, chlorine dioxide and tetrafluoroborate; HX is a molecule formed by hydrogen combined with at least one of hydroxyl group, alkoxy group, halogen, nitrate, acetate ion, sulfate ion, phosphate ion, oxalate ion, perchlorate ion, chlorate ion, chlorine dioxide and tetrafluoroborate; "a" represents a value obtained from subtracting 2 from M's atomic value of M; and "b" is an integral number from 1 to 4.

2. The method of claim 1, wherein the annealing of the thin film is performed at about 100° C. to about 350° C.

3. The method of claim 1, further comprising:
    irradiating the thin film with ultraviolet rays.

4. The method of claim 1, wherein the metal oxalate comprises at least one selected from the group of zinc, tin, indium and gallium, which is combined with oxalate ion.

5. The method of claim 1, the method further comprising:
    forming a etch stopper on the semiconductor pattern; and
    forming a source electrode and a drain electrode which are overlapped with the semiconductor pattern and the etch stopper, the source electrode being spaced apart from the drain electrode.

6. The method of claim 1, wherein the composition for manufacturing an oxide semiconductor is coated by at least one of spin coating, dip coating, bar coating, screen printing, slide coating, roll coating, slit coating, spray coating, dipping, dip-pen, nano dispensing, and printing inkjet.

* * * * *